(12) United States Patent
Yao

(10) Patent No.: US 6,369,585 B2
(45) Date of Patent: Apr. 9, 2002

(54) SYSTEM AND METHOD FOR TUNING A RESONANT STRUCTURE

(75) Inventor: Chong Guo Yao, Pacheco, CA (US)

(73) Assignee: Siemens Medical Solutions USA, Inc., Iselin, NJ (US)

( * ) Notice: Subject to any disclaimer, the term of this patent is extended or adjusted under 35 U.S.C. 154(b) by 0 days.

(21) Appl. No.: 09/165,523

(22) Filed: Oct. 2, 1998

(51) Int. Cl.[7] .............................................. G01R 27/26
(52) U.S. Cl. ...................................... 324/636; 324/633
(58) Field of Search ................................ 324/636, 652, 324/653, 71.3, 316, 318, 322, 633; 333/17.1, 219, 227, 231, 235; 315/5.41, 505, 507; 250/492.3

(56) References Cited

U.S. PATENT DOCUMENTS

| | | | |
|---|---|---|---|
| 3,829,764 A | * 8/1974 | Bosisio | 324/632 |
| 4,234,855 A | 11/1980 | Busacca et al. | 331/90 |
| 4,247,828 A | 1/1981 | Busacca et al. | 331/90 |
| 4,267,604 A | 5/1981 | Sato | 455/193 |
| 4,667,111 A | * 5/1987 | Glavish et al. | 250/492.2 |
| 4,835,446 A | * 5/1989 | Nation et al. | 315/5.13 |
| 5,001,438 A | * 3/1991 | Miyata et al. | 315/503 |
| 5,325,063 A | * 6/1994 | Morgan | 324/636 |
| 5,438,274 A | * 8/1995 | Bitar et al. | 324/636 |
| 5,451,847 A | * 9/1995 | Nakanishi | 315/505 |
| 5,491,422 A | * 2/1996 | Bitar et al. | 324/636 |
| 5,734,168 A | * 3/1998 | Yao | 250/492.3 |

OTHER PUBLICATIONS

Serway (Physic for Scientics and Engineers pp. 490–491 third edition 1992).*

* cited by examiner

Primary Examiner—Safet Metjahic
Assistant Examiner—Vincent Q. Nguyen

(57) ABSTRACT

An embodiment of the present invention includes the use of a single connection to measure the resonance frequency of main cells or side cells of a resonant structure, such as a linear accelerator cavity structure. Only one antenna is require to perform both the tasks of exciting a cavity structure and picking up the resonant frequency signal. According to an embodiment of the present invention, a first antenna probe is inserted into the main cells of a linear accelerator cavity structure. The first antenna probe includes an antenna window which may be positioned approximately in the center of a main cell adjacent to a target side cell in order to measure the resonance frequency of a target side cell. All non-target side cells adjacent to the main cell aligned with the window antenna are then shorted. For example, the non-target cells may be shorted by metal surrounding the first antenna probe at locations other than the antenna window. A signal is sent and a resonance frequency is noted. In order to measure the resonance frequency of a target main cell according to an embodiment of the present invention, a second antenna probe is inserted into a side cell adjacent to the target main cell. The main cells adjacent to the target main cell are then shorted and side cells adjacent to the target main cell are also shorted. A signal is sent and the resonance frequency of the target main cell is then measured.

25 Claims, 10 Drawing Sheets

SYSTEM AND METHOD FOR TUNING A RESONANT STRUCTURE

FIELD OF THE INVENTION

The present invention relates to an apparatus for emitting radiation. In particular, the present invention relates to tuning resonant structures, such as cavities in a linear accelerator.

BACKGROUND OF THE INVENTION

Linear accelerators may be used for various purposes. For example, linear accelerators may be used in scientific research or in the medical environment. Although linear accelerators may be used for a variety of applications, the examples herein are described in conjunction with the medical environment for exemplary purposes. In medical applications, a beam of charged particles, such as electrons, from a linear accelerator may be directed at a target which is made of a material having a high atomic number to produce an X-ray beam for radiation therapy. In other applications, protons or heavy ions may be used instead of electrons. Alternatively, the beam of charged particles may be applied directly to a patient during a radio-surgical procedure. Such radio-surgery has become a well established therapy in the treatment of brain tumors. A high energy beam may be directed at a localized region to cause a breakdown of one or both strands of the DNA molecule inside cancer cells, with the goal of at least retarding further growth and preferably providing a curative cancer treatment.

A conventional linear accelerator ("linac") typically includes a series of accelerating cavities that are aligned along a beam axis. A particle source, typically an electron gun, directs charged particles into the first accelerator cavity. As the charged particles travel through the succession of accelerating cavities, the particles are focussed and accelerated by means of an electromagnetic field. For example, a radio frequency (RF) source may be coupled to the accelerator to generate the necessary field to operate the linac. Often, the output beam is directed to a magnetic bending system that functions as an energy filter. In the medical environment, either an output beam of high energy particles or an X-ray beam generated by impinging a target with the output beam is then employed for radiation treatment of a patient.

Optimal performance of the accelerator typically requires a match between the resonant frequency of the cavity structure and the frequency of the driving signal. In order to determine the resonant frequency of a cavity structure, such as a side-coupled structure, each cavity or cell of the structure is typically tuned to a specific cell frequency which may be different from a resonant frequency of the structure. The frequencies of the various cells in the structure may be combined to result in the resonant frequency of the structure. Once the resonant frequency of each cell is determined, the cavity of a cell may be deformed to match a predetermined required frequency of each cell.

Typically, a linear accelerator, such as a linear accelerator used in a medical environment, includes multiple access holes in the structure. These access holes may include a beam hole through a set of main cells which may be used for facilitating passage of a beam of charged particles and also for facilitating measurement of the frequency of cells. Access holes may also include side holes which may also be used for the purpose of measuring the frequency of cells. Two connections, one to convey an excite signal and the other to convey a pickup signal, are typically inserted into these holes for the purposes of radiating a signal to excite a particular cell and measuring a resonant frequency of that cell. The two connections are typically inserted into access holes. For S band frequencies, an example of a size of such a beam hole is an inside diameter of approximately 10 mm, while an example of a size of a side access hole is an inside diameter of approximately 8 mm. For X band frequencies, an example of a size of a beam hole is approximately 3–4 mm. For further background information regarding the tuning of a resonant cavity, LOS ALAMOS MESON PROTON FACILITY (LAMP) 805 MHZ ACCELERATOR STRUCTURE TUNING AND ITS RELATION TO FABRICATION AND INSTILATION, by G. R. Swan, IEEE NS-16, 1965 may be referred.

Once tuning is completed, the side access holes in the cavity structures are typically sealed in order to establish and maintain a vacuum inside the cavity structures. It would be desirable to be able to tune a structure which is simpler to manufacture by minimizing the holes typically used for tuning. An example of such a structure is disclosed in U.S. Pat. No. 5,734,168, entitled MONOLITHIC STRUCTURE WITH INTERNAL COOLING FOR MEDICAL LINAC, issued to Yao on Mar. 31, 1998. Despite the fact that the holes in such a structure, or in a similar structure, are minimized, it is still typically necessary to tune such a structure. Additionally, tuning a structure designed for X band frequencies may be difficult due to the need for fitting two connections into such a small beam hole. The present invention addresses such a need.

SUMMARY OF THE INVENTION

An embodiment of the present invention includes the use of a single connection to measure the resonance frequency of main cells or side cells of a resonant structure, such as a linear accelerator cavity structure. Only one antenna is required to perform both the tasks of exciting a cavity structure and picking up the resonant frequency signal. According to an embodiment of the present invention, a first antenna probe is inserted into the main cells of a linear accelerator cavity structure. The first antenna probe includes an antenna window which may be positioned approximately in the center of a main cell adjacent to a target side cell in order to measure the resonance frequency of a target side cell. All non-target side cells adjacent to the main cell aligned with the antenna window are then shorted. For example, the non-target cells may be shorted by metal surrounding the first antenna probe at locations other than the antenna window. A signal is sent and a resonance frequency is noted. In order to measure the resonance frequency of a target main cell according to an embodiment of the present invention, a second antenna probe is inserted into a side cell adjacent to the target main cell. The main cells adjacent to the target main cell are then shorted and side cells adjacent to the target main cell are also shorted. A signal is sent and the resonance frequency of the target main cell is then measured.

A method according to an embodiment of the present invention for determining a resonance frequency of a resonant structure is presented. Such a method comprises steps of providing an excite signal in a first portion of a resonant structure, the excite signal being provided by a probe, wherein the probe includes a single signal wire. A reflected signal is received through the probe, and a resonance frequency of a second portion of the resonant structure is determined.

In another aspect of the invention, a system according to an embodiment of the present invention for determining a resonance frequency of a resonant structure is also presented. The system comprises a first portion of a resonant structure; a second portion of the resonant structure; and a probe. The probe includes a single signal wire, and the probe is configured to provide an excite signal in the first portion of the resonant structure. The probe is also configured to receive a reflected signal related to a resonance frequency of the second portion of the resonant structure.

DETAILED DESCRIPTION OF THE PREFERRED EMBODIMENTS

The following description is presented to enable one of ordinary skill in the art to make and to use the invention and is provided in the context of a patent application and its requirements. Various modifications to the preferred embodiments will be readily apparent to those skilled in the art and the generic principles herein may be applied to other embodiments. Thus, the present invention, is not intended to be limited to the embodiment shown but is to be accorded the widest scope consistent with the principles and features described herein.

Figure 1:
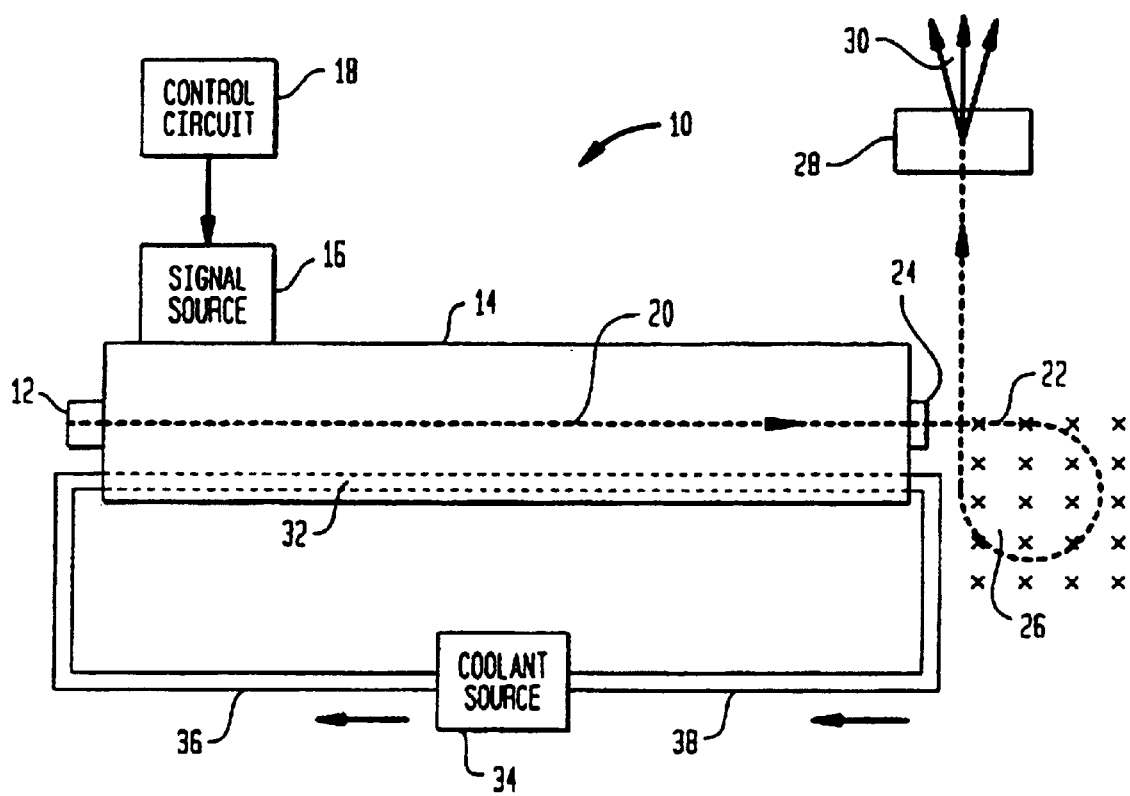
FIG. 1 is a schematic diagram of an example of a clinical linear accelerator.

FIG. 1 is a schematic diagram of an example of a resonant structure, such as a clinical linear accelerator system 10, which may be used for medical treatment. Linear accelerator 10 is shown as having a particle source 12 for directing charged particles into an accelerator device 14. Particle source 12 may be an electron gun which injects electrons into an input end of the accelerator device. The electron gun is a conventional component of clinical linear accelerators ("linacs").

A driving signal is introduced into the accelerator device 14 by a signal source 16. Signal source 16 introduces an electromagnetic wave having a suitable frequency. Radio frequency or high frequency sources are conventionally employed. Optionally, the frequency is dynamically controlled by a control circuit 18 that is connected within a closed loop system (not shown).

Electrons introduced into accelerator device 14 by electron gun 12 are accelerated along a beam axis 20 of the device. The electrons obtain a high energy by virtue of the energy-transfer relationship with the electromagnetic waves established by connection with the signal source 16. A pulsed or steady state output beam 22 of electrons is emitted from an exit window 24, which is located at the delivery end of device 14.

Output beam 22 of charged particles is typically directed to a magnetic bending system 26, which acts as an energy filter. The output beam is typically bent approximately 270 degrees, and is then directed into a target 28, such as a gold or tungsten target. Impingement of the target by the output beam 22 generates an X-ray beam 30 which may be employed for radiation treatment of a patient. Alternatively, the output beam 22 can be applied directly to a patient such as during a radio-surgical procedure to treat a brain tumor. The operations of the magnetic bending system 26 and the target 28 are well known by persons skilled in the art.

Figure 2:
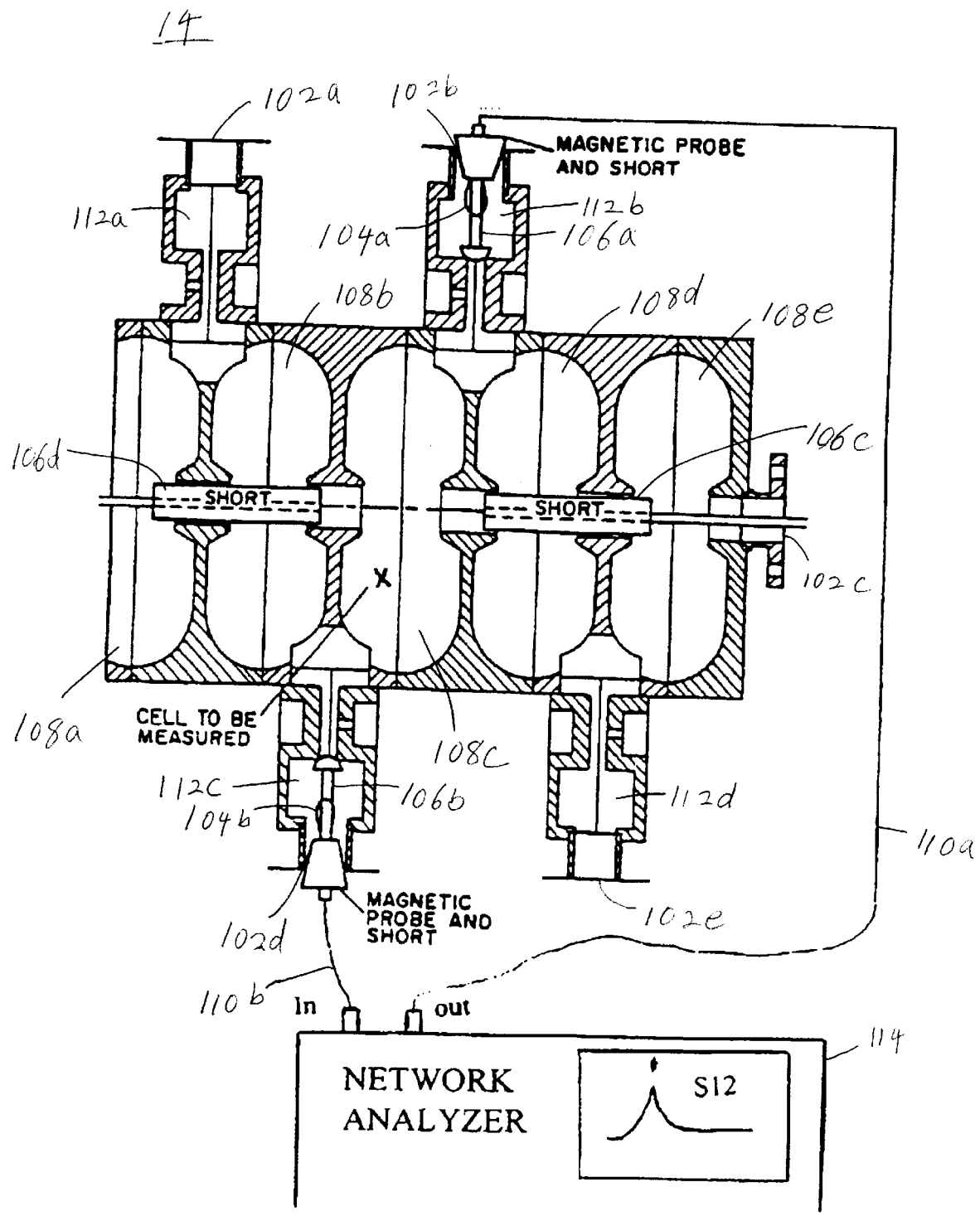
FIG. 2 is a schematic diagram of a linear accelerator cavity structure shown during conventional measurement of a resonance frequency of a main cell.

FIG. 2 is a schematic diagram of an example of a resonant structure, such as an accelerator device 14. Accelerator device 14 of FIG. 2 is shown during a resonance frequency measuring of a main cell for the purpose of tuning accelerator device 14. Accelerator device 14 is shown to include multiple main cells 108a–108e. Additionally, accelerator device 14 also includes side cells 112a–112d. Accelerator device 14 is also shown to include holes 102a–102e, typically used to facilitate the measuring of resonance frequency within the cells.

Accelerator device 14 is shown to be in the process of having a main cell, such as main cell 108c, measured for its resonance frequency. A network analyzer 114, such as Hewlett Packard's HP 8719C (50 MHZ–13.5 GHZ), is shown to be coupled to accelerator device 14 through connections 110a and 110b. Connection 110a is coupled to an excite loop 104a and a metal bar 106a, both of which are inserted into side cell 112b which is adjacent to the target main cell 108c. Excite loop 104a radiates electromagnetic waves, while metal bar 106a shorts side cell 112b to keep side cell 112b from responding to excite loop 104a.

Connection 110b is shown to be coupled to a pickup loop 104b and a metal bar 106b, both of which are inserted into side cell 112c, which is adjacent to the target main cell 108c. Pickup loop 104b picks up the resonance frequency of target main cell 108c. The metal bar 106b is inserted into side cell 112c for the purpose of shorting side cell 112c to keep it from resonating. In addition to shorting side cells adjacent to target main cell 108c, main cells 108b and 108d, which are adjacent to target main cell 108c, are also shorted by metal bars 106d and 106c.

Figure 3:
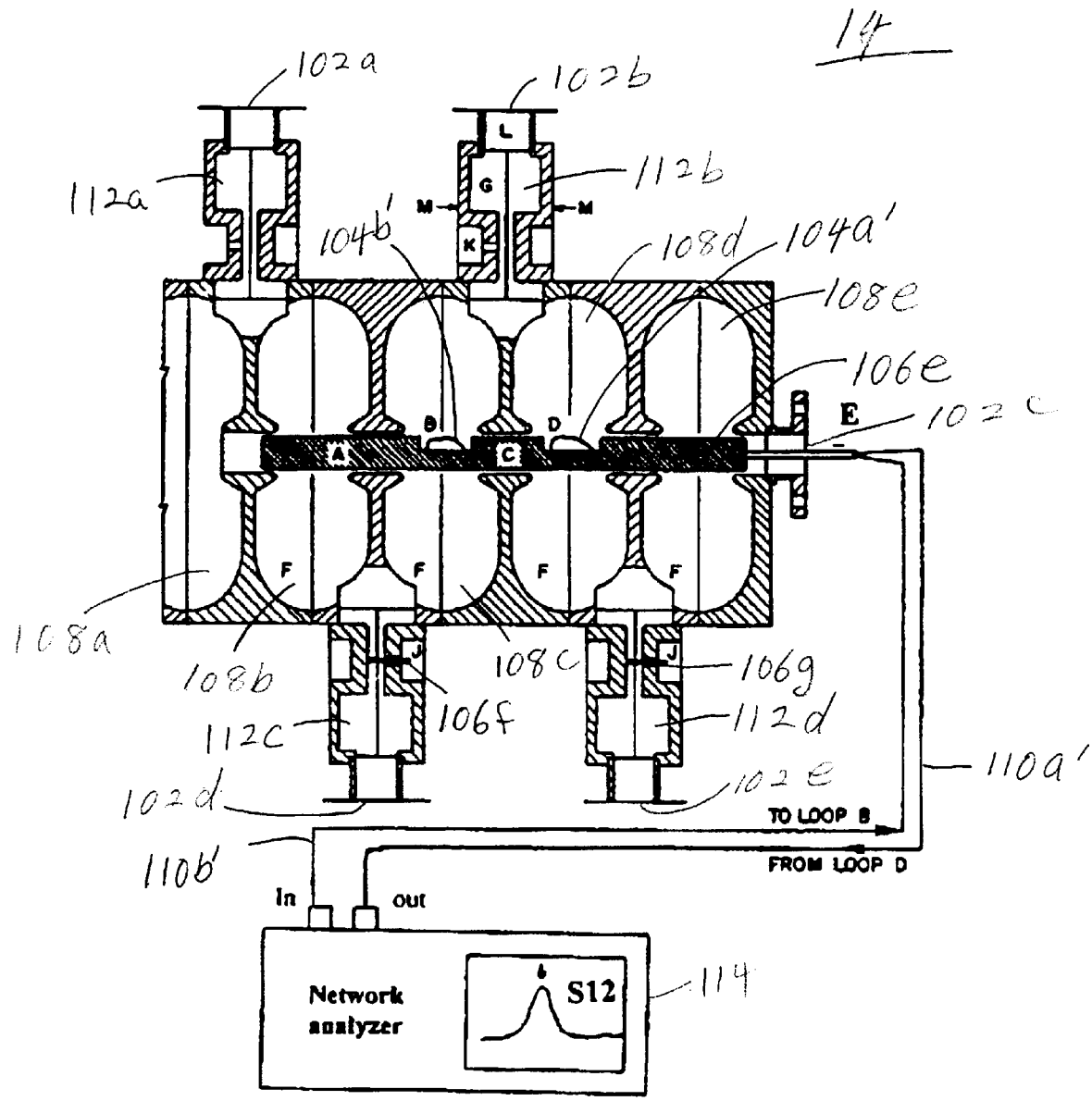
FIG. 3 is a schematic diagram of a linear accelerator cavity structure shown during a conventional measuring of a side cell.

FIG. 3 is another schematic diagram of accelerator device 14. In this diagram, a target side cell 112b is shown having its resonance frequency measured. In this example, the conventional method for measuring a target side cell 112b includes pickup signal loop 104b' and excite signal loop 104a', both of which are located within a metal bar 106e. Connection 110a' (associated with excite loop 104a') and connection 110b' (associated with pickup signal loop 104b') are both threaded through metal bar 106e. Metal bar 106e serves the function of shorting all main cells 108b–108e adjacent to or close to target side cell 112b. Side cells 112c–112d, which are adjacent to main cells 108c and 108d, which in turn are adjacent to target side cell 112b, also have metal bars 106f–106g to short the side cells 112c–112d.

When excite loop 104a' sends out electromagnetic waves, only the non-shorted target side cell 112b will typically respond with a resonance frequency which is picked up by pickup loop 104b'. Accordingly, the resonance frequency of target side cell 112b may be measured.

Although resonance frequencies may be measured in the manner shown in FIGS. 2 and 3, it may be difficult to measure resonance frequencies in such a manner when the holes, such as holes 102a–102e of FIGS. 2 and 3, are reduced in size. The reduction of the holes allowing access to the linear accelerator may result in a simplified linear accelerator manufacturing process. However, the conventional sizes of the metal bar 106e housing two connectors 110a' and 110b' may be too large for insertion into these smaller holes.

It would be desirable to have a system and method for measuring both side cells and main cells of a linear accelerator which may be used with very small access holes, such as 3 mm–5 mm, as well as standard hole sizes. The present invention addresses such a need.

Figure 4:
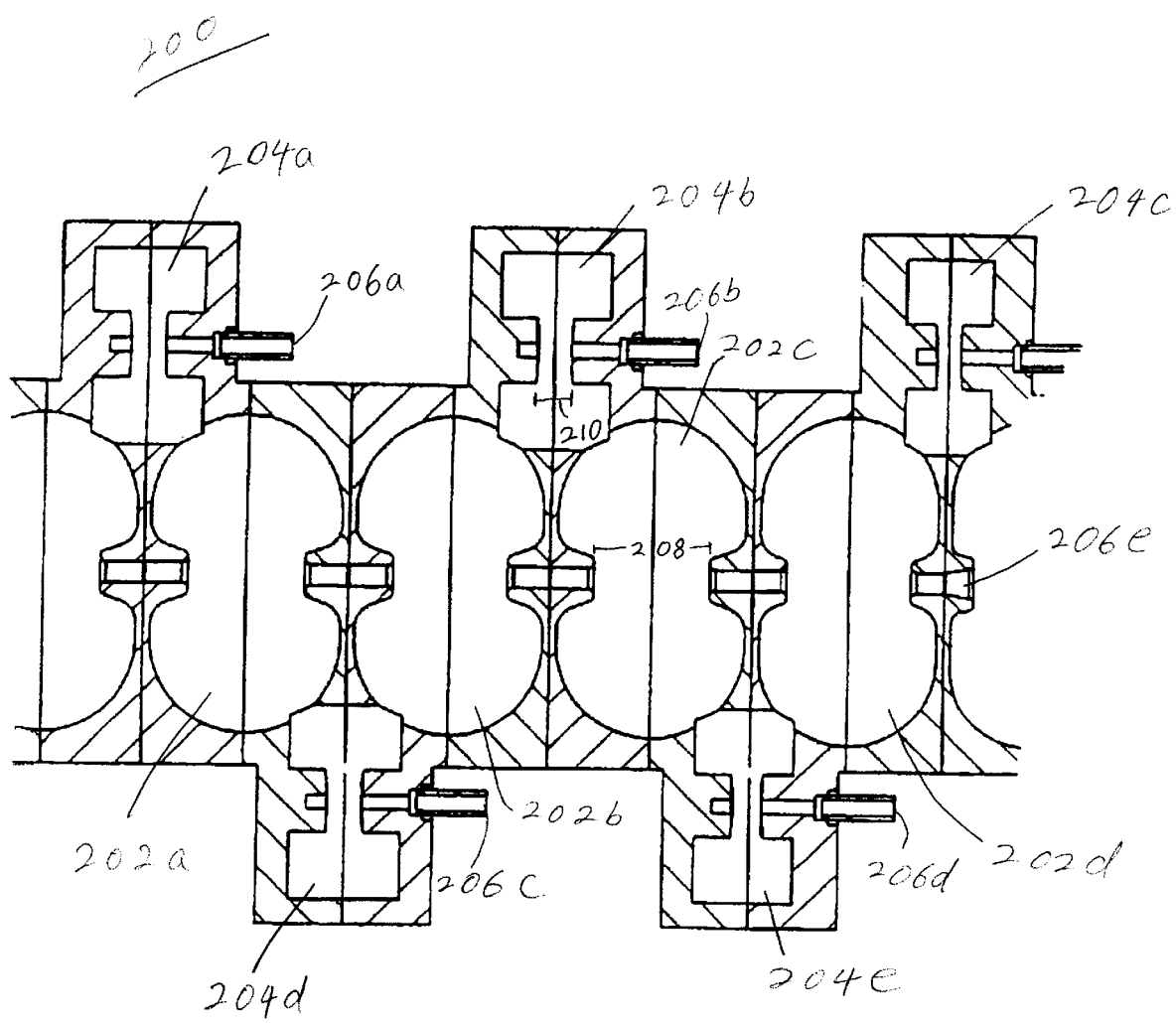
FIG. 4 is a schematic diagram of a linear accelerator cavity structure which is particularly well suited to use the present invention.

FIG. 4 is a schematic diagram of a resonant structure, such as a linear accelerator 200, with minimized access holes, such as the linear accelerator described in U.S. Pat. No. 5,734,168, entitled MONOLITHIC STRUCTURE WITH INTERNAL COOLING FOR MEDICAL LINAC, issued Mar. 31, 1998 to Yao.

Linear accelerator 200 may be a side coupled cavity structure. A side coupled cavity structure is a standing wave structure operating in the π/2_mode. It is shown to include main cells 202a–202d in a line which accelerate particles, and side cells 204a–204e located on the sides of main cells 202a–202d which play a coupling role. Linear accelerator 200 is also shown to include small access holes 206a–206e. The side cell access holes 206a–206d may be smaller than access holes in other types of accelerator structures, such as access holes 102a–102e of FIG. 2. For example, the side cell access holes 206a–206d may have an inside diameter of approximately 3 mm. Although linear accelerator 200 will appear substantially similar to, if not identical to, accelerator device 14 of FIGS. 2 and 3, linear accelerator 200 is more likely to be easier to manufacture due to the smaller size of the access holes 206a–206e.

Figure 5A:
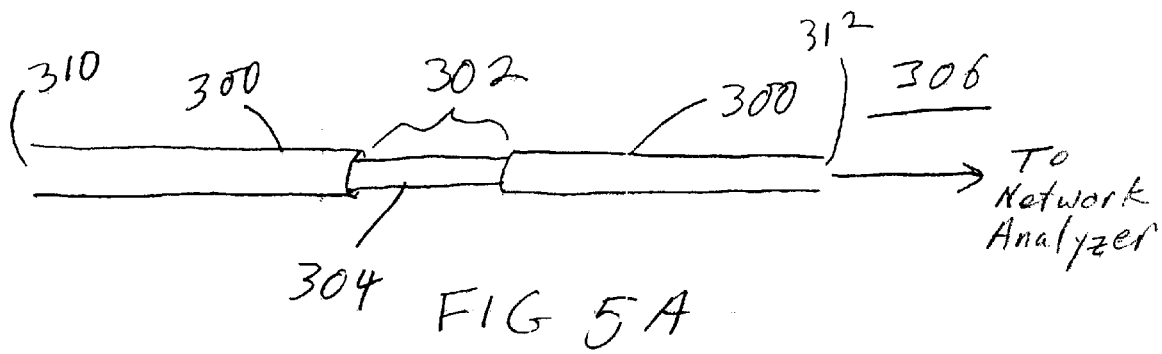
FIGS. 5A–5C are illustrations of antenna shapes according to an embodiment of the present invention.
Figure 5B:
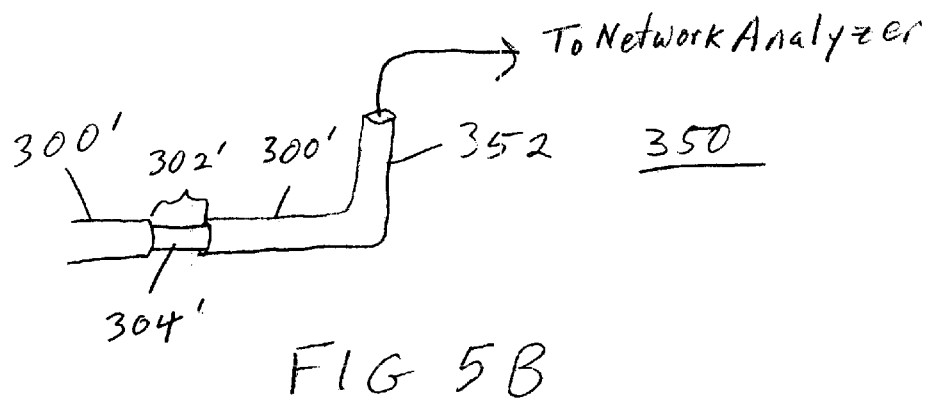
Figure 5C:
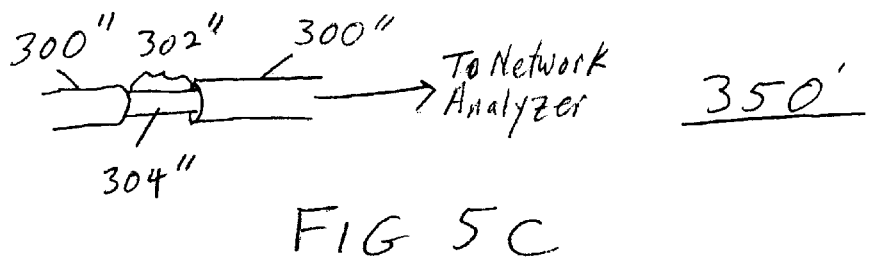

FIGS. 5a–5c illustrate various antenna probes according to an embodiment of the present invention. FIG. 5a shows an antenna probe that includes a metallic encasing 300 (for example, a copper encasing) surrounding a signal wire 304. Antenna probe 306 may be a standard coaxial cable with a copper metal casing 300. Signal wire 304 is exposed in an antenna window 302 which is not encased by metal encasing 300. The antenna probe 306 shown in FIG. 5a is a long antenna probe which may be used to measure a target side cell according to an embodiment of the present invention.

The length of the long antenna probe 306 should be long enough to short at least one full length of a cell adjacent to the cell that includes antenna window 302. A designer may prefer the long antenna probe 306 to be long enough to span all main cells adjacent to or close to the target side cell. For example, for S band frequencies, the length of the antenna probe 306 may be 10 cm from an edge of antenna window 302 to a non-connector end 310 of the long antenna probe 306, and 30 cm long from an edge of antenna window 302 to a connector end 312. For X band frequencies, an example of a length of the antenna probe 306 may be 5 cm from an edge of antenna window 302 to non-connector end 310. The length between an edge of antenna window 302 to connector end 312 depends on the length of each accelerator structure.

The circumference of the long antenna probe 306 should be small enough to fit the beam aperture (such as hole 206e of FIG. 4) in the main cells. For example, the circumference of the long antenna probe may be 5 mm. Antenna window 302 should be smaller than a gap within the main cell, such as gap 208 of main cell 202c of FIG. 4. For example, antenna window 302 may be in the range of 5–7 mm.

FIG. 5b shows a short antenna probe 350 according to an embodiment of the present invention. Short antenna probe 350 may be used for tuning a target main cell and is intended to be inserted into a side cell adjacent to the target main cell. Short antenna probe 350 may also be a coaxial cable with metal encasing 300' with the signal wire 304' exposed in an antenna window 302'. The length of short antenna probe 350 should be long enough to span the width of a side cell gap, such as gap 210. An example of the length of short antenna probe 350 is 4 cm. The circumference of short antenna probe 350 should be small enough to fit into a side cell access hole, such as access hole 206b of FIG. 4. An example of the circumference of short antenna probe is 1.5 mm. The length of antenna window 302' should be of a size that is small enough to fit within the confines of the side cell gap, such as gap 210, with enough metal exposed inside the side cell gap to short the side cell. An example of the size of the antenna window is 3 mm–5 mm for both long antenna probe and short antenna probe for S band frequencies. An example of an amount of metal used to short the side cell may be 2 mm of metal length. Short antenna probe 350 is shown to include a bent handle-like structure 352 for ease of use. FIG. 5c illustrates a short antenna probe 350' similar to that shown in FIG. 5b, except without the bent handle-like structure 352.

Antenna windows 302, 302', and 302" not only radiate the excite signal, they also pick up a reflected signal to determine the resonance frequency of the target cell. Accordingly, only one signal wire is required to be within the coaxial of the long and short antenna probes. Since only one signal wire is required to be encased in metal, very small coaxial cables can be used as long and short antenna probes. For example, an outside diameter of 1.5 mm for an antenna probe can be used. Accordingly, the system and method according to the present invention is particularly applicable to X band (9–11 GHz), as well as S band (approximately 3000 MHZ).

Figure 6:
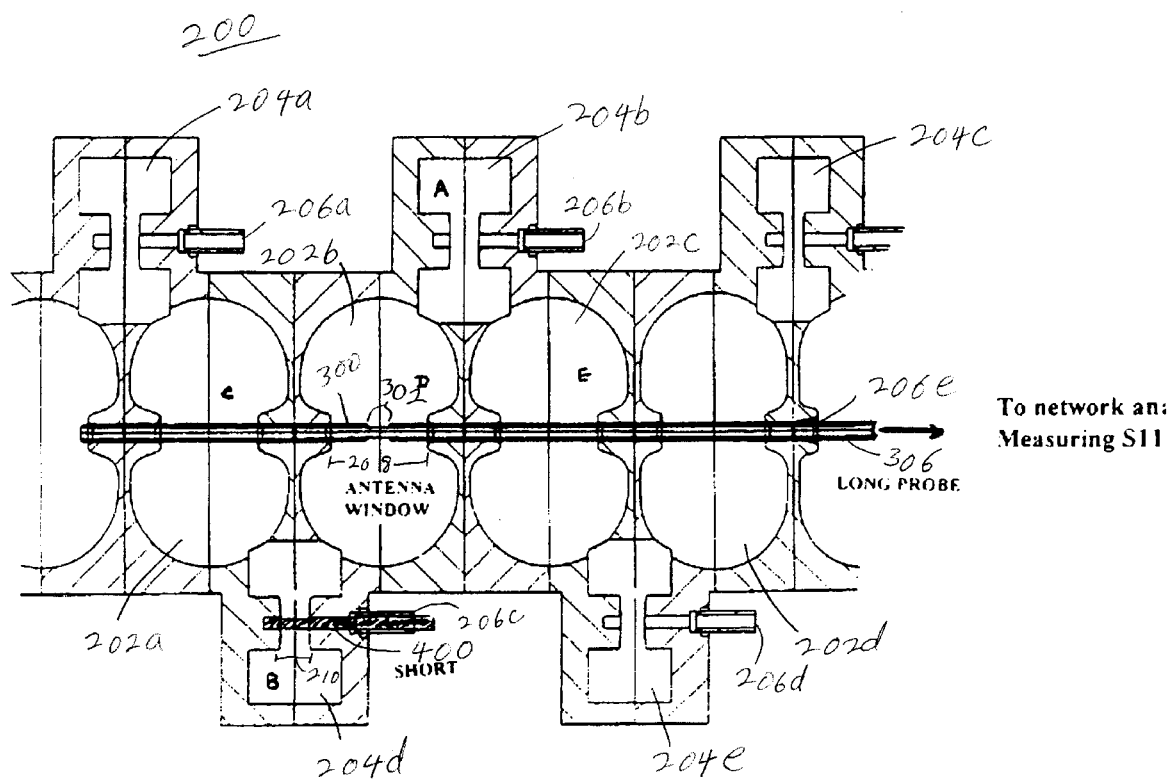
FIG. 6 is a schematic diagram of a linear accelerator cavity structure during the measurement of a side cell according to an embodiment of the present invention.
Figure 7:
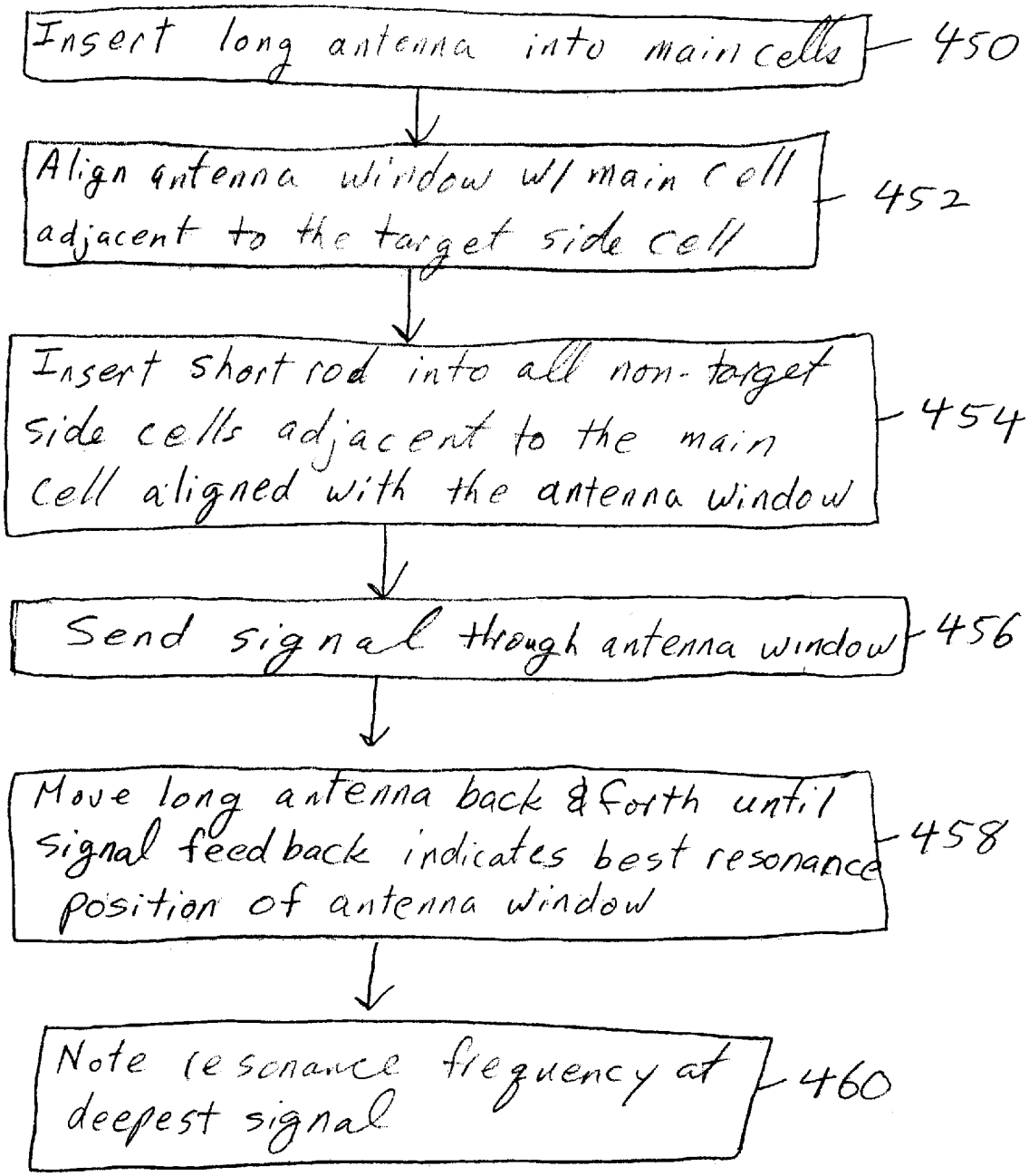
FIG. 7 is a flow diagram of a method according to an embodiment of the present invention for measuring a side cell.

FIG. 6 is a schematic diagram of linear accelerator 200 during a measurement of a resonance frequency of a target side cell 204b according to an embodiment of the present invention. The diagram of FIG. 6 may be referenced along with the flow diagram of FIG. 7. A long antenna probe 306 is inserted into main cells 202a–202d (step 450). The antenna window 302 of the long antenna probe 306 is then aligned with a main cell adjacent to the target side cell 204b (step 452). To align antenna window 302 into its position within gap 208 of main cell 202b, an operator may measure the long antenna probe against a schematic model of linear accelerator 200. Preferably, antenna window 302 is within gap 208 of main cell 202b, as well as portions of metal 300 such that the excite signal may be radiated from antenna window 302 while metal 300 shorts main cell 202b to keep it from responding to the excite signal.

A short metal rod 400 is inserted into all non-target side cells 204d adjacent to the main cell 202b which is aligned with the antenna window 302 (step 454). Short rod 400 may be made of any conductive metal such as copper, with a diameter small enough to fit into access holes 206a–206d. The length of the short metal bar should be long enough to fill gap 210 of the side cell 204d. For example, the length of short metal bar 400 may be approximately 5 cm, with a circumference of 3 mm.

A signal is then sent through antenna window 302 (step 456). The signal sent through antenna window 302 is a micro-signal with varying frequency sweeping. This excite signal may be generated from a signal generator within a certain range of frequencies. The range of frequency sweeping is dependant upon the accelerator's structure design. For example, a range of about 20 MHZ may be used for S band frequencies, and a range of about 60 MHZ may be used for X band frequencies. The frequency sweeping range may be reduced to locate the peak resonance frequency with greater accuracy. Note that antenna window 302 is preferably smaller than the main cell gap 208 such that metal encasing 300 is also exposed in main cell 202*b* in order to short the signal being sent through antenna window 302. Metal 300 is preferably located in all main cells 202*b*–202*c* adjacent to target side cell 204*b*. However, the operator may prefer to place metal 300 in all main cells 202*a*–202*d* near the target side cell 204*b* to minimize interference. Since all non-target side cells 204*d* adjacent to the main cell 202*b* aligned with the antenna window 302 is also shorted, the only cell responding to the excite signal radiating from antenna window 302 should be target side cell 204*b*.

If a frequency of the signal is not at resonance frequency, then that signal is simply reflected back since that frequency is not absorbed by the target side cell 204*b*. The antenna window may radiate an excite signal through a range of frequencies and pick up the reflected signal simultaneously. A network analyzer, such as Hewlett Packard's HP 8719C (50 MHZ–13.5 GHZ), is capable of indicating the reflected signal. The reflected signal can then be measured in relation to reflected signals being sent back at other frequencies. At the resonance frequency of the target cell, the electromagnetic waves are absorbed by atoms in the target cell. Accordingly, there is substantially less reflected signal at resonance frequency than at non-resonance frequencies.

Figure 8:
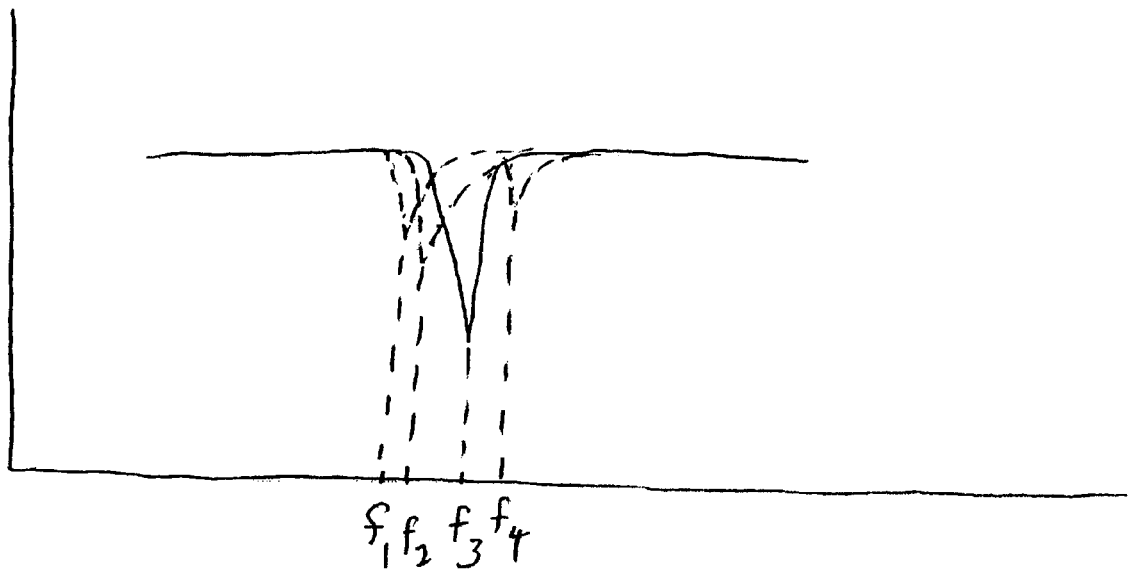
FIG. 8 is an example of a graph of a resonant frequency of a cell in a cavity structure.

This effect can be seen in the graph shown in FIG. 8. At various non-resonance frequencies $f_1$, $f_2$, and $f_4$, the reflected signal can be seen. However, at the target cell's resonance frequency, in this example frequency $f_3$, there is a sharp dip in the reflected signal due to the absorption of the electromagnetic waves at the resonance frequency.

The long antenna probe 306 may be moved back and forth until the signal feedback (the signal shown in FIG. 8) indicates a best resonance position of antenna window 302 (step 458). The resonance frequency may then be noted at the deepest signal, such as frequency $f_3$ (step 460).

Figure 9:
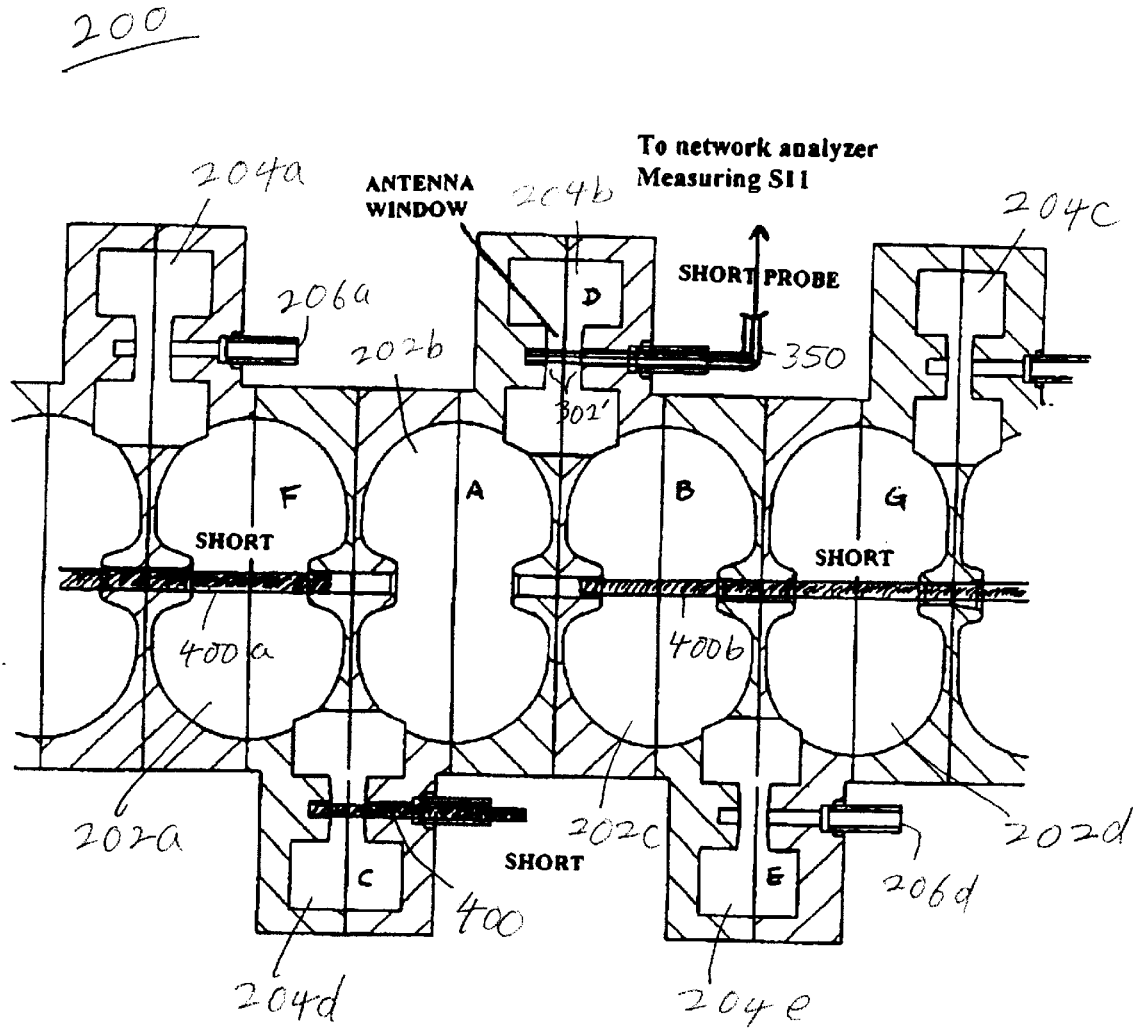
FIG. 9 is a schematic diagram of a linear accelerator cavity structure during a measurement of a main cell according to an embodiment of the present invention.
Figure 10:
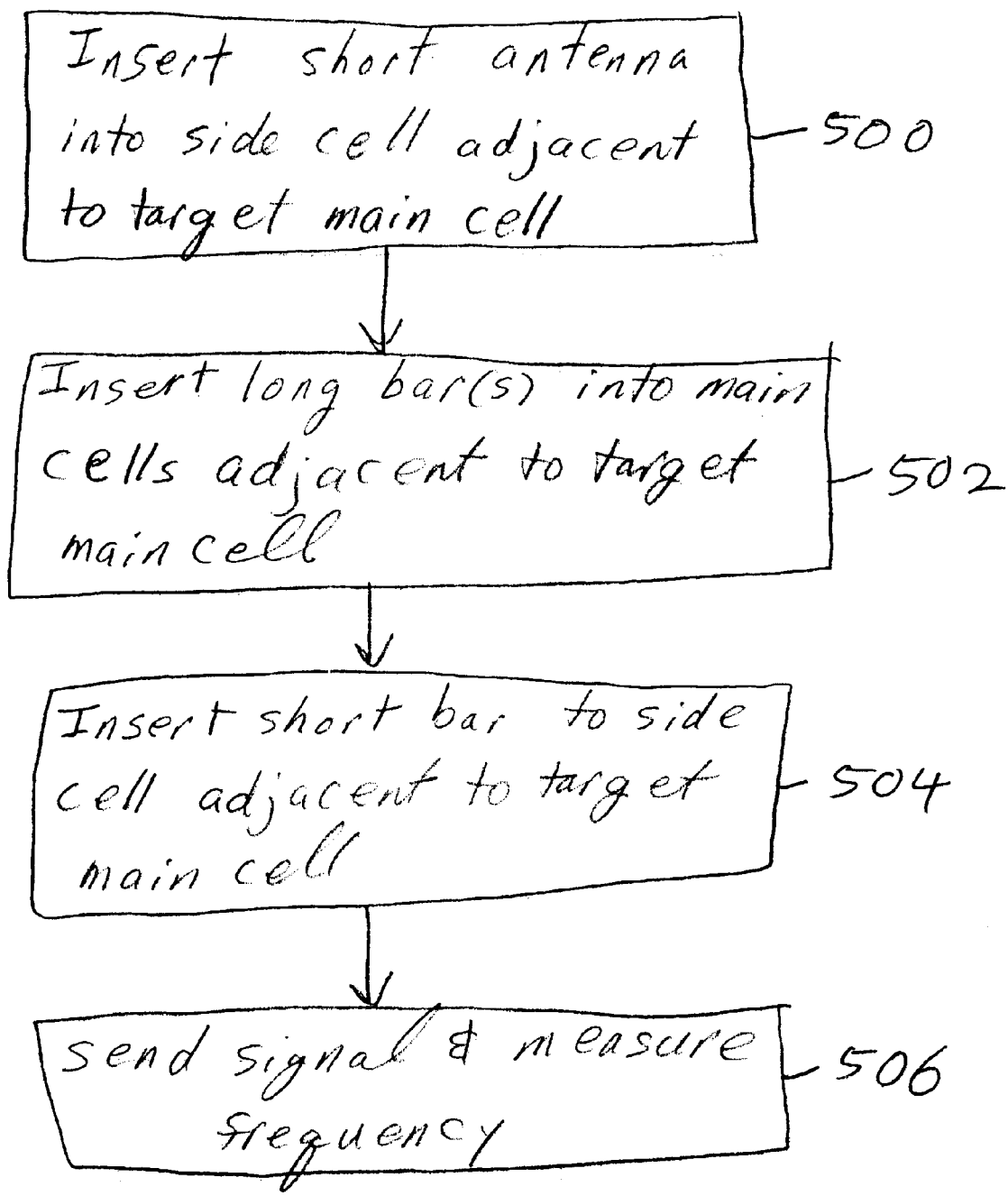
FIG. 10 is a flow diagram of a method according to an embodiment of the present invention for measuring a resonance frequency of a main cell.

FIG. 9 is a schematic diagram of linear accelerator 200 during a resonance frequency measurement of a target main cell 202*b*. The diagram shown in FIG. 9 may best be understood by referring to the flow diagram of FIG. 10 which shows an example of a method according to an embodiment of the present invention for measuring a resonance frequency of a target main cell. A short antenna probe, such as probe 350 of FIG. 5*b*, is inserted into a side cell 204*b* adjacent to a target main cell 202*b* (step 500). A long metal bar or bars 400*a*–400*b* are inserted into main cells 202*a*–202*d* (step 502). Long bars 400*a*–400*b* may be any metal, such as copper. Their purpose is to short main cells 202*a*, 202*c*–202*d* which are near target main cell 202*b*. Shorting main cell 202*c* adjacent to the side cell 204*b* with antenna window 302' ensures that the target main cell 202*b* is the only main cell which will be measured for its resonance frequency. Shorting main cells 202*a* and 202*d* should minimize interference with the target main cell 202*b* resonance frequency measurement.

A short metal bar 400 is also inserted into side cell 204*d* adjacent to target main cell 202*b* to short side cell 204*d* (step 504). An excite signal is sent through antenna window 302' and the resonance frequency of the target main cell 202*b* is then measured (step 506).

Although the present invention has been described in accordance with the embodiment shown, one of ordinary skill in the art will readily recognize that there could be variations to the embodiment and these variations would be within the spirit and scope of the present invention. For example, although examples herein are directed toward a linear accelerator with small access holes, such as the linear accelerator described in conjunction with FIGS. 4, 6, and 9, the present invention is also suitable for use with a linear accelerator with larger access holes, such as the linear accelerator described in conjunction with FIGS. 2 and 3. Accordingly, many modifications may be made by one of ordinary skill in the art without departing from the spirit and scope of the appended claims.

What is claimed is:

1. A method for determining a resonance frequency of a device including a plurality of cells forming a resonant structure, the method comprising:
    using a probe to provide an excite signal in a first cell, wherein the probe includes a signal wire;
    receiving a signal through the probe in response to the excite signal, the signal being reflected from a second cell;
    shorting a third cell; and
    determining a resonance frequency of the second cell based on the reflected signal.

2. The method of claim 1, wherein the probe is a coaxial cable with metal surrounding at least a portion of the signal wire.

3. The method of claim 1, wherein the probe includes an antenna window.

4. The method of claim 1, further comprising shorting the first cell of the system.

5. The method of claim 1, wherein the third cell of the system is adjacent to the first cell of the system.

6. The method of claim 1, wherein the third cell of the system is adjacent to the second cell of the system.

7. The method of claim 1, wherein the system includes a linear accelerator in which a beam passes through cells positioned as main cells and does not pass through cells positioned as side cells.

8. The method of claim 1, wherein the system includes a side coupled cavity structure.

9. The method of claim 1, wherein the first cell is a main cell of the system.

10. The method of claim 9, wherein the second cell is a side cell of the system.

11. The method of claim 1, wherein the first cell is a side cell of the system.

12. The method of claim 11, wherein the second cell is a main cell of the system.

13. A system including a plurality of cells positioned to form a resonant structure, said system further comprising:
    a probe providing an excite signal in a first cell wherein the probe includes a signal wire;
    the probe receiving a reflected signal in response to said excite signal; and
    means for determining a resonance frequency of a second cell based on said reflected signal when a third cell is shorted.

14. The system of claim 13, wherein the probe is a coaxial cable with metal surrounding at least a portion of the signal wire.

15. The system of claim 13, wherein the probe includes an antenna window.

16. A system for determining a resonance frequency of a device including a plurality of cells positioned to form a resonant structure, said system further comprising:
- a first cell;
- a second cell;
- a third cell; and
- a probe including a signal wire, wherein the probe is configured to provide an excite signal in the first cell the probe also being configured to receive a reflected signal in response to the excite signal related to a resonance frequency of the second cell, and wherein the third cell is shorted.

17. The system of claim 16, wherein the probe is a coaxial cable with metal surrounding at least a portion of the signal wire.

18. The system of claim 16, wherein the probe includes an antenna window.

19. The system of claim 16, further comprising shorting the first cell.

20. The system of claim 16, wherein the system is a linear accelerator system in which a beam passes through cells positioned as main cells and does not pass through any cells positioned as side cells.

21. The system of claim 16, wherein the system includes a side coupled cavity structure.

22. The system of claim 16, wherein the first cell is a main cell of the system.

23. The system of claim 22, wherein the second cell is a side cell.

24. The system of claim 16, wherein the first cell is a side cell.

25. The system of claim 24, wherein the second cell is a main cell.

* * * * *